United States Patent
Oh et al.

(10) Patent No.: US 9,691,841 B2
(45) Date of Patent: Jun. 27, 2017

(54) SEMICONDUCTOR DEVICE

(71) Applicant: SK hynix Inc., Gyeonggi-do (KR)

(72) Inventors: Sung Lae Oh, Chungcheongbuk-do (KR); Chang Man Son, Gyeonggi-do (KR); Sang Hyun Sung, Gyeonggi-do (KR); Dae Hun Kwak, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 100 days.

(21) Appl. No.: 14/198,214

(22) Filed: Mar. 5, 2014

(65) Prior Publication Data

US 2015/0091135 A1    Apr. 2, 2015

(30) Foreign Application Priority Data

Sep. 27, 2013 (KR) .................. 10-2013-0115520

(51) Int. Cl.
| | |
|---|---|
| *H01L 49/02* | (2006.01) |
| *H01L 23/522* | (2006.01) |
| *H01L 29/94* | (2006.01) |
| *H01L 27/11531* | (2017.01) |
| *H01L 27/1157* | (2017.01) |
| *H01L 27/11582* | (2017.01) |

(52) U.S. Cl.
CPC .......... *H01L 28/90* (2013.01); *H01L 23/5223* (2013.01); *H01L 27/11531* (2013.01); *H01L 28/86* (2013.01); *H01L 29/94* (2013.01); *H01L 27/1157* (2013.01); *H01L 27/11582* (2013.01); *H01L 2924/0002* (2013.01)

(58) Field of Classification Search
CPC ............ H01L 28/60; H01L 2924/0002; H01L 2924/00; H01L 23/5223; H01L 27/11531; H01L 27/1157; H01L 27/11582; H01L 28/86; H01L 28/90; H01L 29/94
See application file for complete search history.

(56) References Cited

U.S. PATENT DOCUMENTS

| | | | |
|---|---|---|---|
| 6,570,210 B1* | 5/2003 | Sowlati | H01L 28/82 257/303 |
| 7,276,776 B2* | 10/2007 | Okuda | H01L 23/5223 257/307 |
| 7,298,001 B1* | 11/2007 | Liu | H01G 4/232 257/306 |
| 7,663,175 B2* | 2/2010 | Komura | H01L 23/5223 257/303 |
| 2008/0186651 A1* | 8/2008 | Thompson | H01G 4/228 361/306.3 |
| 2008/0224318 A1* | 9/2008 | Hommel et al. | 257/758 |
| 2013/0049086 A1* | 2/2013 | Ahn | H01L 27/105 257/296 |

(Continued)

FOREIGN PATENT DOCUMENTS

| | | |
|---|---|---|
| KR | 1020100087812 | 8/2010 |
| KR | 1020130023995 | 3/2013 |

*Primary Examiner* — A. Sefer
*Assistant Examiner* — Benjamin Tzu-Hung Liu
(74) *Attorney, Agent, or Firm* — IP & T Group LLP

(57) ABSTRACT

A semiconductor device includes an insulating layer formed on a substrate, and a capacitor including first and second electrodes formed in the insulating layer, wherein a lower surface of the first electrode is formed to have a greater depth than a lower surface of the second electrode in the insulating layer.

4 Claims, 10 Drawing Sheets

(56) References Cited

U.S. PATENT DOCUMENTS

2014/0061855 A1* 3/2014 Kuo .................. H01L 28/90
                                              257/532
2014/0232012 A1* 8/2014 Arai .................. H01L 23/481
                                              257/774

* cited by examiner

SEMICONDUCTOR DEVICE

CROSS-REFERENCE TO RELATED APPLICATION

The present application claims priority of Korean patent application number 10-2013-0115520, filed on Sep. 27, 2013, in the Korean Intellectual Property Office, the entire disclosure of which is incorporated herein by reference in its entirety.

BACKGROUND

Field of Invention

Various embodiments of the present invention relate to a semiconductor device, and more particularly, to a semiconductor device including a capacitor.

Description of Related Art

A semiconductor device includes a cell region and a peripheral circuit region. In the cell region memory cells storing data are arranged. The peripheral circuit region includes transistors as switches for transmitting driving voltages to the memory cells and capacitors.

The capacitors are connected in series or in parallel and occupy a certain area of the semiconductor device in order to obtain necessary capacitance. For high-integration of the semiconductor device, various methods for decreasing an area occupied by a capacitor have been researched. However, if the area occupied by the capacitor decreases, efficiency of the capacitor may deteriorate.

BRIEF SUMMARY

Exemplary embodiments of the present invention are provided to a semiconductor device capable of improving efficiency of a capacitor within a narrow area.

An exemplary embodiment of the present invention provides a semiconductor device including an insulating layer formed on a substrate and a capacitor including first and second electrodes formed in the insulating layer, wherein a lower surface of the first electrode is formed greater depth than a lower surface of the second electrode in the insulating layer.

Another exemplary embodiment of the present invention provides a semiconductor device including a lower wire formed on a substrate in a first direction, impurity injection regions formed inside the substrate adjacent to edges of the lower wire, a first insulating layer formed on the substrate to cover the lower wire, first electrodes passing through the first insulating layer to be connected to the lower wire, a second insulating layer formed on the first insulating layer to cover the first electrodes, and second electrodes passing through the second insulating layer and a part of the first insulating layer to have lower surfaces positioned higher than lower surfaces of the first electrodes, wherein the first and second electrodes form capacitors.

According to the exemplary embodiment of the present invention, the capacitor is formed by using the first and second electrodes passing through the insulating layer, so that the capacitor may occupy a smaller area within the substrate.

Further, according to the exemplary embodiment of the present invention, the lower surfaces of the first and second electrodes passing through the insulating layer are positioned at different heights, i.e., different levels in the substrate, so that a distance between the first and second electrodes may decrease, thereby improving efficiency of the capacitor.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features, and advantages of the present invention will become more apparent to those of ordinary skill in the art by describing in detail embodiments thereof with reference to the attached drawings in which.

DETAILED DESCRIPTION

Figure 1:
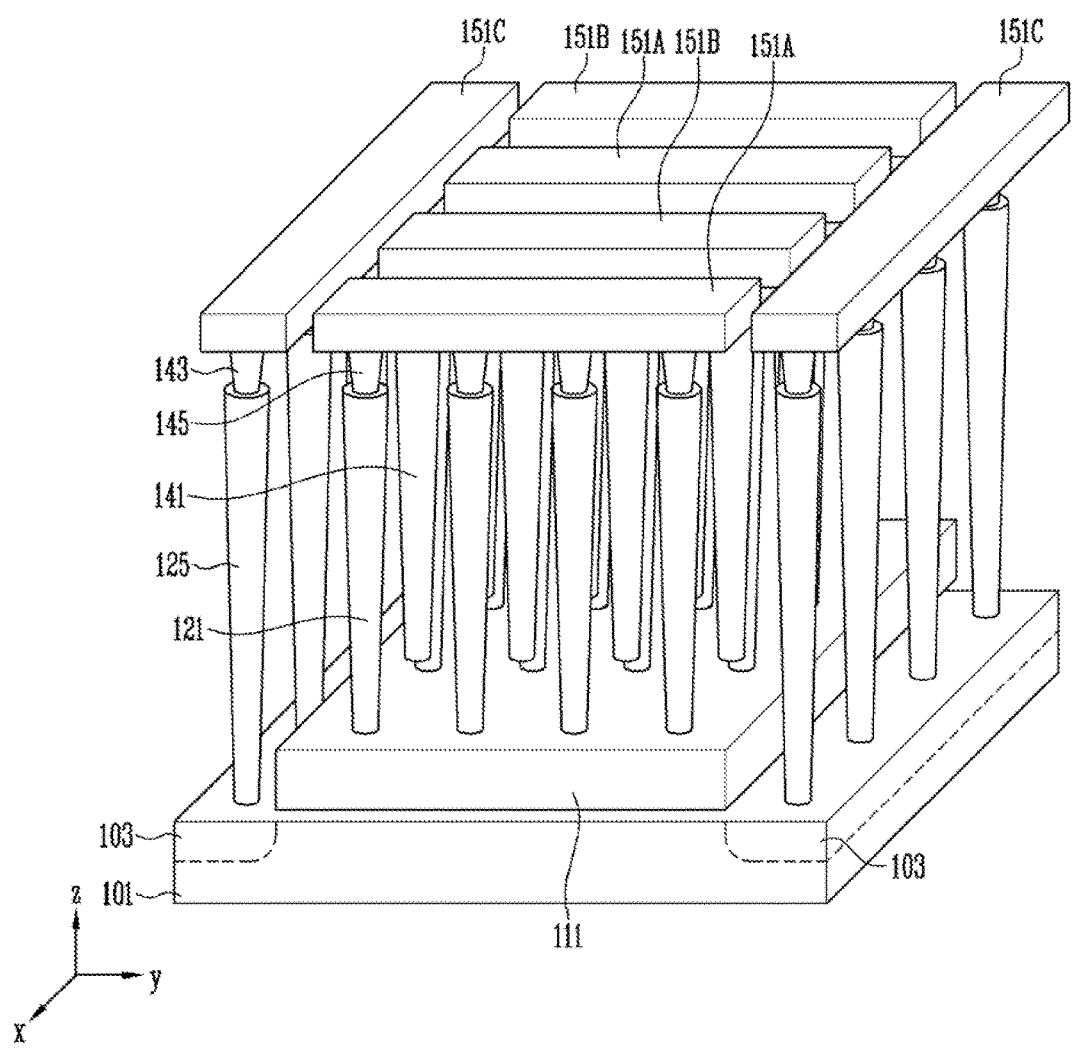
FIGS. 1 to 3 are diagrams describing a capacitor of a semiconductor device according to a first exemplary embodiment of the present invention.

Hereinafter, exemplary embodiments of the present invention will be described with reference to the accompanying drawings in detail. However, the present invention is not limited to an embodiment disclosed below and may be implemented in various forms and the scope of the present invention is not limited to the following embodiments. Rather, the embodiment is provided to more sincerely and fully disclose the present invention and to completely transfer the spirit of the present invention to those skilled in the art to which the present invention pertains, and the scope of the present invention should be understood by the claims of the present invention.

In the drawings, the thicknesses and the intervals of elements are exaggerated for convenience of illustration, and may be exaggerated compared to an actual physical thickness. In describing the present invention, a publicly known configuration irrelevant to the principal point of the present invention may be omitted. It should be noted that in giving reference numerals to elements of each drawing, like reference numerals refer to like elements even though like elements are shown in different drawings.

In the following description, capacitors are formed in a peripheral region of a semiconductor device, and cell structures are formed in a memory cell region of the semiconductor device.

FIG. 1 is a perspective view describing a capacitor of a semiconductor device according to a first exemplary embodiment of the present invention. For convenience of description, an insulating layer is not illustrated in FIG. 1.

Referring to FIG. 1, the semiconductor device according to the first exemplary embodiment of the present invention includes first electrodes 121 and second electrodes 141 for capacitors. The first electrodes 121 and the second electrodes 141 pass through at least one insulating layer (not shown) formed on a substrate 101. The first electrodes 121 and the second electrodes 141 are formed in a direction (for example, a z-direction in the xyz coordinate system) passing through the insulating layer, so that the capacitor may be implemented within a narrow area of the substrate 101.

Lower surfaces of the second electrodes 141 are positioned higher than lower surfaces of the first electrodes 121, and upper surfaces of the second electrodes 141 are positioned higher than upper surfaces of the first electrodes 121. As described above, in the first exemplary embodiment of the present invention, the first electrodes 121 and the second electrodes 141 are positioned at different heights, so that the first electrodes 121 and the second electrodes 141 may be spaced with a short distance compared to a case in which the first electrodes 121 and the second electrodes 141 are disposed at the same height.

The first electrodes 121 and the second electrodes 141 according to the first exemplary embodiment of the present invention are disposed on a lower wire 111 formed on the substrate 101. The second electrodes 141 are spaced apart from the lower wire 111, and the first electrodes 121 are extended up to an upper surface of the lower wire 111 to be connected with the lower wire 111. The lower wire 111 may serve to transmit a signal from the outside to the first electrodes 121. The lower wire 111 may be extended in a first direction (for example, an x-direction in the xyz coordinate system). The first electrodes 121 and the second electrodes 141 may be shaped like pillars, and may be spaced apart from each other to be arranged in a matrix form.

The first electrodes 121 may be connected to the first upper wires 151A formed thereon, and the second electrodes 141 may be connected to second upper wires 151B formed thereon. The first upper wires 151A and the second upper wires 151B may be alternately arranged. A pair of third upper wires 151C may be formed with the first and second upper wires 151A and 151B interposed therebetween.

The first to third upper wires 151A, 151B, and 151C may be formed on the same layer to form the capacitors. For example, a first signal, which is the same as a signal applied to the first electrodes 121, may be applied to the first upper wires 151A, and a second signal, which is the same as a signal applied to the second electrodes 141, may be applied to the second and third upper wires 151B and 151C. Accordingly, the capacitor may be formed between the first upper wires 151A and the second upper wires 151B, and the capacitor may be formed between the first upper wires 151A and the third upper wires 151C. Since the first and second upper wires 151A and 151B are alternately arranged, it may improve efficiency of the capacitor between the first and second upper wires 151A and 151B and prevent generation of the parasitic capacitance.

In the above description, the third upper wires 151C may be connected to impurity injection regions 103 formed inside the substrate 101 through first and second contact plugs 125 and 143. The impurity injection regions 103 are conductive regions formed by injecting p-type impurities or n-type impurities into the substrate 101 adjacent to an edge of the lower wire 111. The impurity injection regions 103 may serve to transmit a signal from the outside to the third upper wires 151C.

The first electrodes 121 are formed to be lower than the second electrodes 141. In this case, the first electrodes 121 are electrically connected to the first upper wires 151A via third contact plugs 145, which are in contact with and connected to upper portions of the first electrodes 121.

Figure 2:
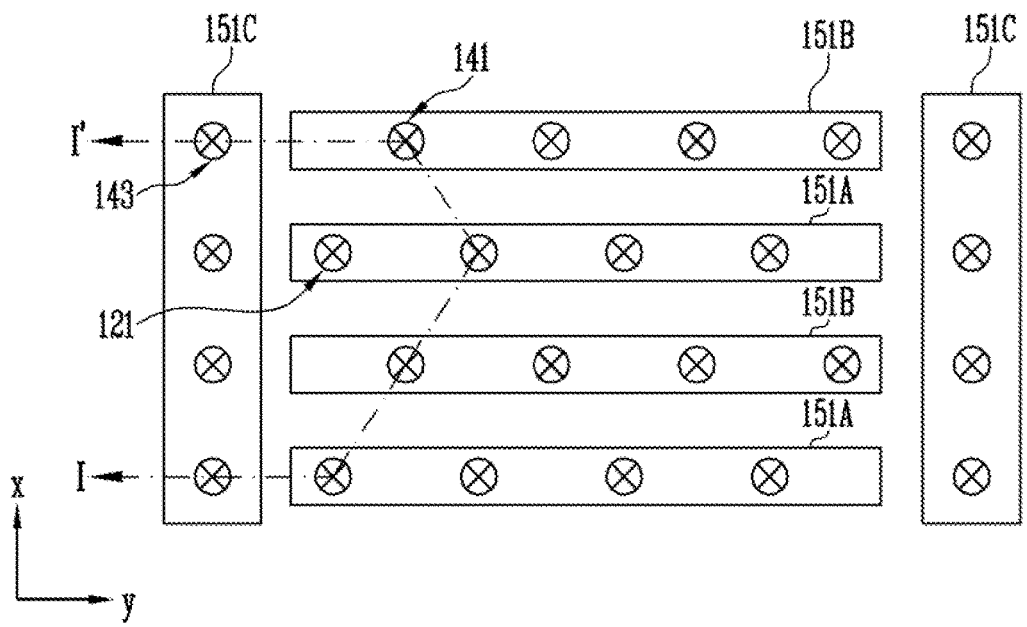

FIG. 2 is a diagram illustrating a layout of the capacitor illustrated in FIG. 1.

The first electrodes 121 and the second electrodes 141 aforementioned with reference to FIG. 1 are alternately arranged in the first direction (for example, the x-direction), which is an extension direction of the lower wire 111 (see FIG. 1). Further, the first electrodes 121 and the second electrodes 141 may be inconsistent with each other to be arranged in a zigzag type along the first direction in order to improve efficiency of the capacitor.

Each of the first upper wires 151A and the second upper wires 151B is extended in a second direction (for example, the y-direction in the xyz coordinate system) crossing the first direction. Accordingly, the plurality of first electrodes 121 are arranged along each of the first upper wires 151A and commonly connected thereto through the third contact plugs 145. The plurality of second electrodes 141 are arranged along each of the second upper wires 151B and commonly connected thereto.

Each of the third upper wires 151C may be extended in the first direction (the x-direction). Accordingly, the third upper wires 151C may form the capacitor with the first upper wires 151A or form the capacitor with the second upper wires 151B.

Hereinafter, a method of forming the capacitor of the semiconductor device according to the first exemplary embodiment of the present invention will be described in more detail with reference to FIG. 3.

Figure 3:
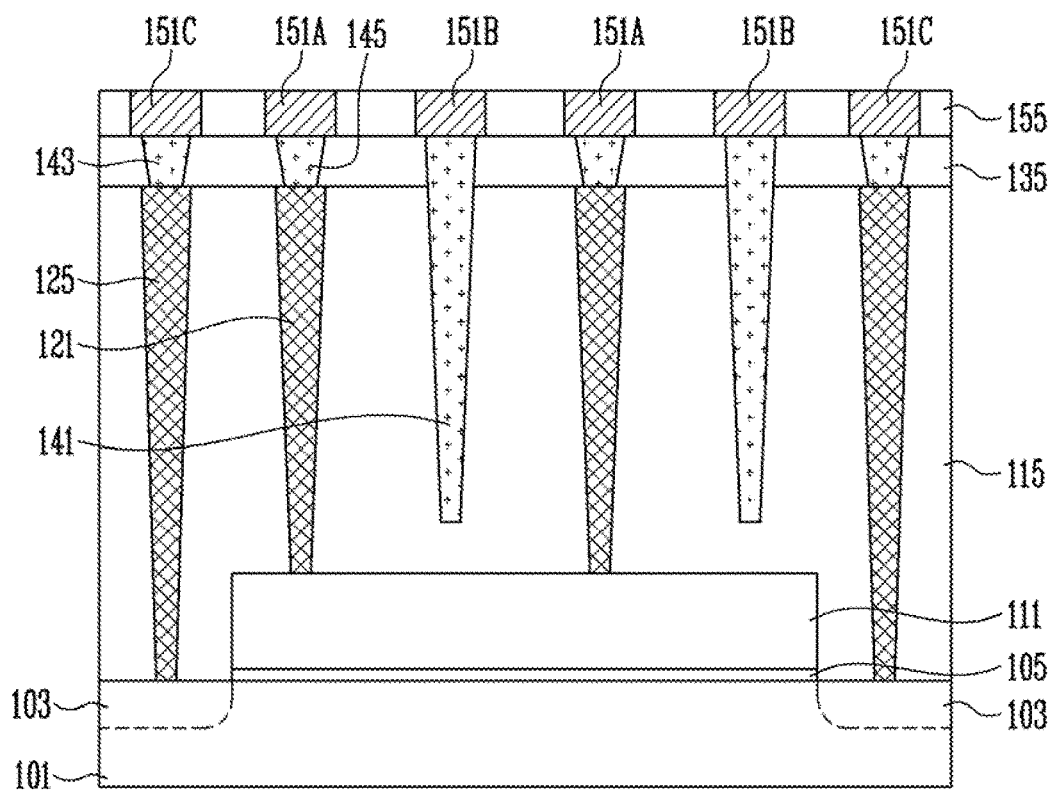

FIG. 3 is a cross-sectional view taken along line "I-I" illustrated in FIG. 2.

Referring to FIG. 3, a gate insulating layer 105 and a first conductive layer for the lower wire 111 are first formed on the substrate 101, and the lower wire 111 is formed by patterning the first conductive layer. When the first conductive layer is patterned, the gate insulating layer 105 may be etched.

Then, the impurity injection regions 103 are formed by injecting impurities into the substrate 101 by using the lower wire 111 as a barrier. Next, a first insulating layer 115 is formed on the substrate 101 to cover the lower wire 111 and the impurity injection regions 103.

After the first insulating layer 115 is formed, a first mask (not illustrated) is formed. Regions, in which the first contact plugs 125 and the first electrodes 121 are to be formed, are exposed by the first mask. Next, first contact holes and first electrodes holes are formed by etching the first insulating layer 115 by an etching process using the first mask as an etching barrier. The first contact holes are formed in the region in which the first contact plugs 125 are to be formed, and the first electrodes holes are formed in the region in which the first electrodes 121 are to be formed. Then, the first contact holes and the first electrodes holes are filled with a second conductive layer, and the first mask is removed. Accordingly, the first contact plugs 125 and the first electrodes 121 are formed.

Next, a second insulating layer 135 is formed on the first insulating layer 115 to cover the first contact plugs 125 and the first electrodes 121. Then, a second mask (not shown) is formed. Regions, in which the second contact plugs 143, the third contact plugs 145, and the second electrodes 141 are to be formed, are exposed by the second mask. The second insulating layer 135 or the first and second insulating layer 115 and 135 is etched by an etching process using the second mask as the etching barrier. Accordingly, the second contact holes are formed in the region in which the second contact plugs 143 are to be formed, third contact holes are formed in the region in which the third contact plugs 145 are to be formed, and the second electrode holes are formed in the region in which the second electrodes 141 are to be formed. Then, the second contact holes, the third contact holes, and the second electrode holes are filled with the third conductive layer, and the second mask is removed. Accordingly, the second contact plugs 143, the third contact plugs 145, and the second electrodes 141 are formed.

The second electrode holes are disposed between the first electrode holes. Bottom surfaces of the second electrode holes are positioned higher than bottom surfaces of the first electrode holes. That depths of the second electrode holes passing through the first insulating layer 115 is smaller than depths of the first electrode holes passing through the first insulating layer 115. As the depths of the second electrode holes get closer to the depths of the first electrode holes, the amount of etching the first insulating layer 115 in a radial direction of the second electrode holes is increased when the etching process for forming the second electrode holes is performed. Accordingly, when the depths of the second electrode holes are formed to be equal to the depths of the first electrode holes, in order to prevent the lateral walls of the second electrode holes from being connected to the first electrode holes, an etching margin is to be secured by forming the second electrode holes and the first electrode holes with a sufficiently long distance therebetween. In the first exemplary embodiment of the present invention, the depths of the second electrode holes are formed to be smaller than the depths of the first electrode holes, so that the etching margin of the first insulating layer 115 may be secured. Accordingly the first electrode holes and the second electrode holes may be formed with a decreased distance therebetween, thereby improving capacitance between the first electrodes 121 and the second electrodes 141.

After the aforementioned process is performed, a third insulating layer 155 is formed on the second insulating layer 135 to cover the second contact plugs 143, the third contact plugs 145, and the second electrodes 141. Next, a third mask (not shown) through which the regions, in which the first to third upper wires 151A, 151B, and 151C are to be formed, are exposed are formed, and trenches are formed by etching the third insulating layer 155 by the etching process using the third mask as the etching barrier. Then, the trenches are filled with a fourth conductive layer, and the third mask is removed. Accordingly, the first to third upper wires 151A, 151B, and 151C are formed.

Figure 4:
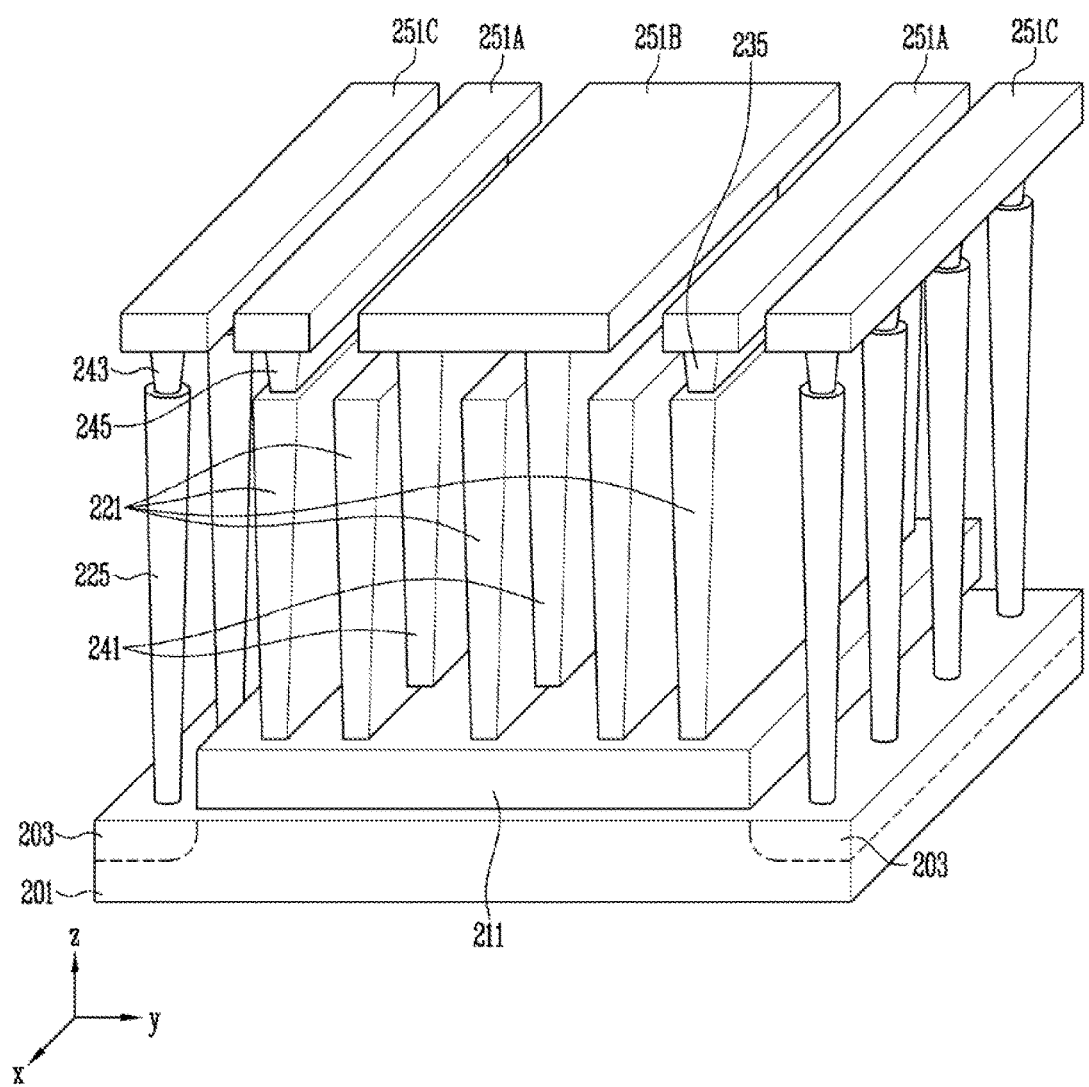
FIGS. 4 to 6 are diagrams describing a capacitor of a semiconductor device according to a second exemplary embodiment of the present invention.

FIG. 4 is a perspective view illustrating a capacitor of a semiconductor device according to a second exemplary embodiment of the present invention. For convenience of description an insulating layer is not illustrated in FIG. 4.

Referring to FIG. 4, the semiconductor device according to the second exemplary embodiment of the present invention includes first electrodes 221 and second electrodes 241 for capacitors, which pass through at least one insulating layer (not shown) formed on a substrate 201. The first electrodes 221 and the second electrodes 241 are formed in a direction (for example, a z-direction in the xyz coordinate system) passing through the insulating layer, so that the capacitor may be implemented within a narrow area of the substrate 201.

Lower surfaces of the second electrodes 241 are positioned higher than lower surfaces of the first electrodes 221, and upper surfaces of the second electrodes 241 are positioned higher than upper surfaces of the first electrodes 221. As described above, in the second exemplary embodiment of the present invention, the first electrodes 221 and the second electrodes 241 are positioned at different heights, so that the first electrodes 221 and the second electrodes 241 may be spaced with a shorter distance compared to a case in which the first electrodes 221 and the second electrodes 241 are disposed at the same height.

The first electrodes 221 and the second electrodes 241 according to the second exemplary embodiment of the present invention are disposed on a lower wire 211 formed on the substrate 201. The second electrodes 241 are spaced apart from the lower wire 211 and the first electrodes 221 are extended up to an upper surface of the lower wire 211 to be connected with the lower wire 211. The lower wire 211 may serve to transmit a signal from the outside to the first electrodes 221. The lower wire 211 may be extended in a first direction (for example, an x-direction in the xyz coordinate system). Each of the first electrodes 221 and the second electrodes 241 are extended in an extension direction (the x-direction) of the lower wire 211 to be formed in a line shape.

Some of the first electrodes 221 may be connected to first upper wires 251A formed thereon, and the second electrodes 241 may be commonly connected to the second upper wire 251B formed thereon. A pair of third upper wires 251C may be further formed with the first and second upper wires 251A and 251B interposed therebetween. The first to third upper wires 251A, 251B, and 251C may be formed on the same layer to form the capacitor.

Detailed arrangements of the first and second electrodes 221 and 241 and the first to third upper wires 251A, 251B, and 251C will be described below with reference to FIG. 5.

In the above description, the third upper wires 251C may be connected to impurity injection regions 203 formed inside the substrate 201 through first and second contact plugs 225 and 243. The impurity injection regions 203 are conductive regions formed by injecting p-type impurities or n-type impurities into the substrate 201 adjacent to an edge of the lower wire 211. The impurity injection regions 203 may serve to transmit a signal from the outside to the third upper wires 251C.

The first electrodes 221 are formed to be lower than the second electrodes 241. Accordingly, third contact plugs 245 may be further formed on some of the first electrodes 221 in order to connect some of the first electrodes 221 to the first upper wires 251A.

Figure 5:
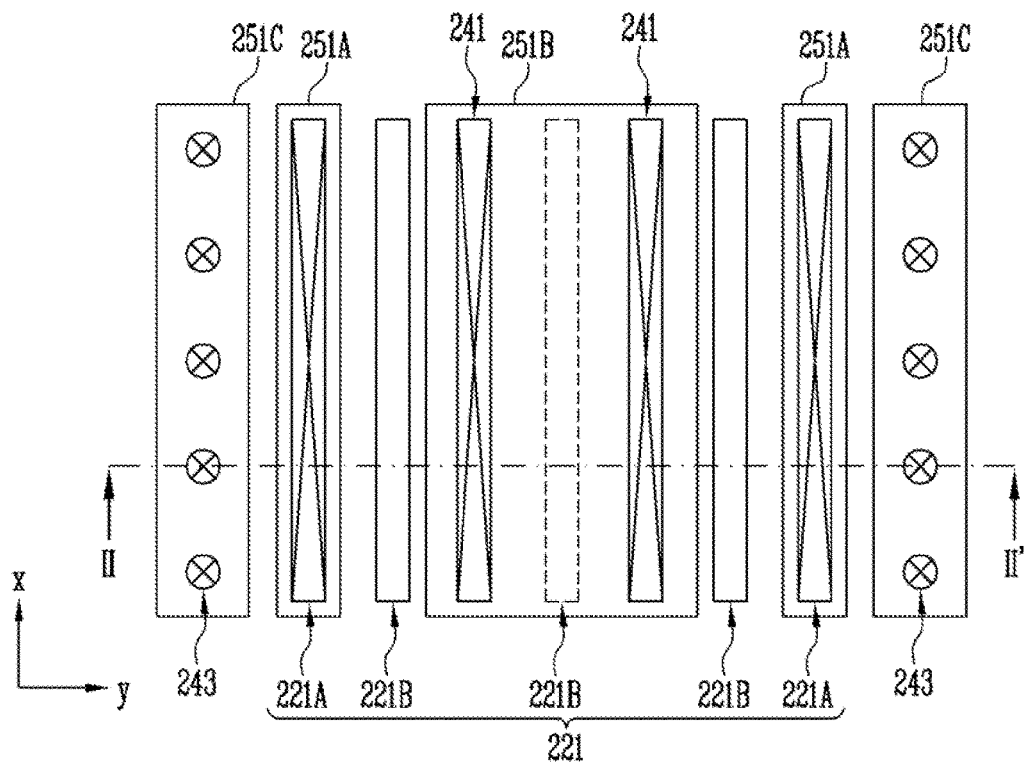

FIG. 5 is a diagram illustrating a layout of the capacitor illustrated in FIG. 4.

Referring to FIG. 5, each of the first electrodes 221 and the second electrodes 241 may be extended in the first direction (for example, the x-direction), which is the extension direction of the lower wire 211 (see FIG. 4) to be formed in a line shape. The first electrodes 221 and the second electrodes 241 may be arranged to be spaced apart from each other in a second direction (the y-direction) crossing the first direction.

The first electrodes 221 may be divided into outermost electrodes 221A adjacent to an edge of the lower wire 211 (see FIG. 1), and internal electrodes 221B positioned between the outermost electrodes 221A. The internal electrodes 221B and the second electrodes 241 are alternately arranged, and the capacitor is formed between the internal electrodes 221B and the second electrodes 241.

The first upper wires 251A may be positioned on the outermost electrodes 221A and may be connected to the outermost electrodes 221A through the third contact plug 245 (see FIG. 1). The first upper wires 251A are disposed to face the third upper wires 251C, and the second upper wire 251B is disposed between the first upper wires 251A to be connected to the second electrodes 241. Each of the first to third upper wires 251A, 251B and 251C are formed to be extended in the extension direction (the x-direction) of the first and second electrodes 221 and 241.

A first signal, which is the same as a signal applied to the first electrodes 221, may be applied to the first upper wires 251A, and a second signal, which is the same as a signal applied to the second electrodes 241, may be applied to the second and third upper wires 251B and 251C. Accordingly, the capacitor may be formed between the first upper wires 251A and the second upper wires 251B, and the capacitor may be formed between the first upper wires 251A and the third upper wires 251C. Accordingly, in the second exemplary embodiment of the present invention, it may improve efficiency of the capacitor and prevent generation of the parasitic capacitance.

Hereinafter, a method of forming the capacitor of the semiconductor device according to the second exemplary embodiment of the present invention will be described in more detail with reference to FIG. 6.

Figure 6:
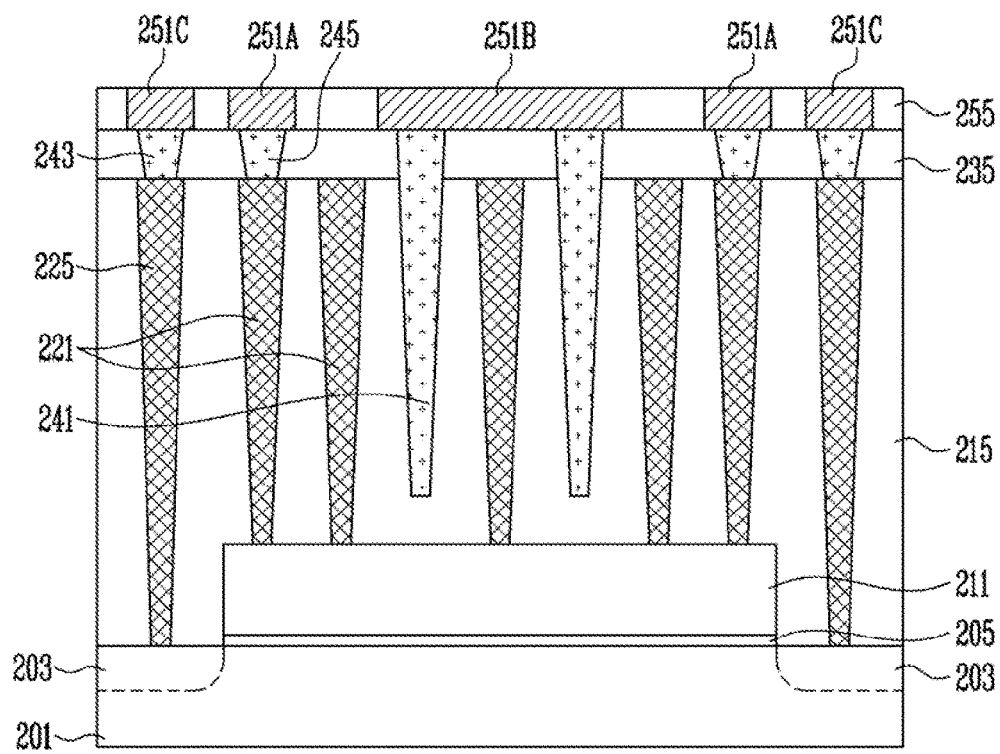

FIG. 6 is a cross-sectional view taken along line illustrated in FIG. 5.

Referring to FIG. 6, the gate insulating layer 205 and the lower wire 211 may be formed on the substrate 201, and the impurity injection regions 203 may be formed inside the substrate 201 by the same method described with reference to FIG. 3.

Further, a first insulating layer 215, first contact plugs 225, the first electrodes 221, a second insulating layer 235, second contact plugs 243 third contact plugs 245, the second electrodes 241, a third insulating, layer 255, and the first to third upper wires 251A, 251B, and 251C may be formed by applying the method described with reference to FIG. 3. In the second exemplary embodiment of the present invention, shapes and arrangements of the first electrodes 221, the third contact plugs 245, the second electrodes 241, and the first and second upper wires 251A and 251B are different from those of the first exemplary embodiment, but a fabricating method thereof is the same as that of the first exemplary embodiment.

Figure 7:
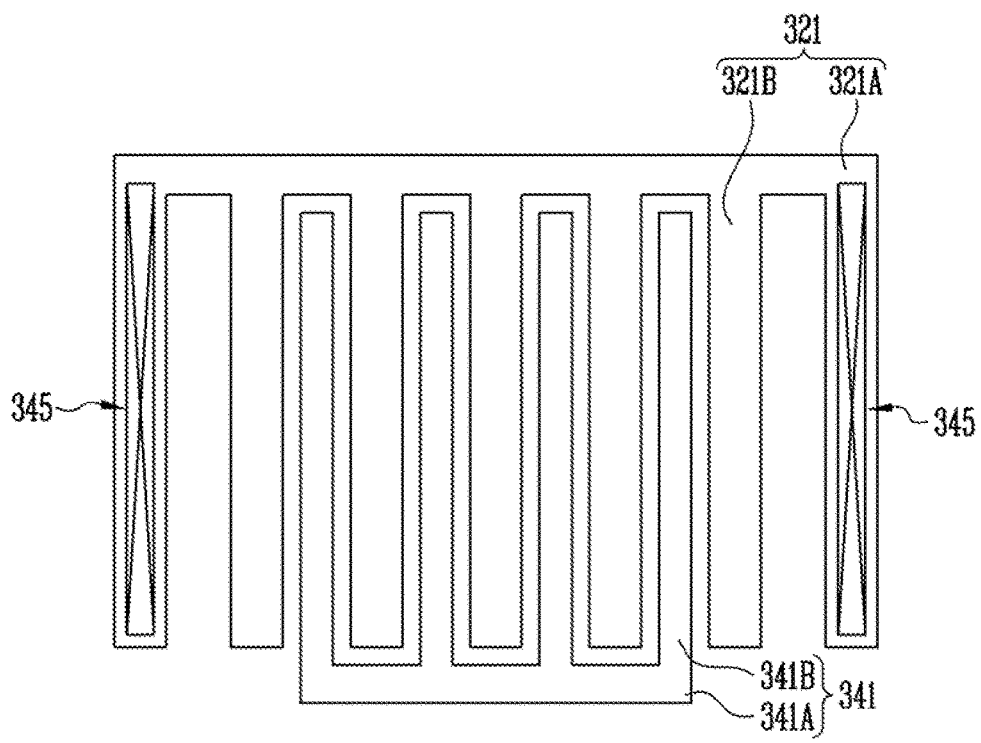
FIG. 7 is a diagram describing a capacitor of a semiconductor device according to a third exemplary embodiment of the present invention.

FIG. 7 is a diagram for describing a capacitor of a semiconductor device according to a third exemplary embodiment of the present invention. For convenience of description, the same configurations, which are already described in the first and second exemplary embodiments, are not illustrated in FIG. 7. Thus, only shapes of a first electrode and a second electrode, and a position of a third contact plug are illustrated in FIG. 7.

Referring to FIG. 7, the first electrode 321 may include a first line portion 321A and second line portions 321B protruding from the first line portion 321A in a horizontal' direction. The second electrode 341 may include a third line portion 341A facing the first line portion 321A with the second line portions 321B interposed therebetween, and fourth line portions 341B protruding from the third line portion 341A in a horizontal direction. The fourth line portions 341B of the second electrode 341 and the second line portions 321 of the first electrode 321 may be alternately disposed.

A lower surface of the second electrode 341 is positioned higher than a lower surface of the first electrode 321 likewise to the aforementioned exemplary embodiments. Accordingly, in the third exemplary embodiment of the present invention, the first electrode 321 and the second electrode 341 may be spaced with a decreased distance, thereby improving efficiency of the capacitor. Especially, in the third exemplary embodiment of the present invention, it may narrow spaces between the second lines portions 321B of the first electrode 321 and the fourth line portions 341B of the second electrode 341.

Outermost lines portions among the second line portions 321B may be connected to first upper wires (not shown) through third contact plugs 345 formed thereon. Further, some of the second line portions 321B disposed between the outermost line portions and the fourth line portions 341B may overlap with a second upper wire (not shown) formed thereon. The fourth line portions 341B may be connected to the second upper wire.

The capacitor of the semiconductor device according to the third exemplary embodiment of the present invention may be fabricated by applying the fabricating method of the capacitor according to the aforementioned first exemplary embodiment, so that a detailed description of the fabricating method will be omitted.

Figure 8:
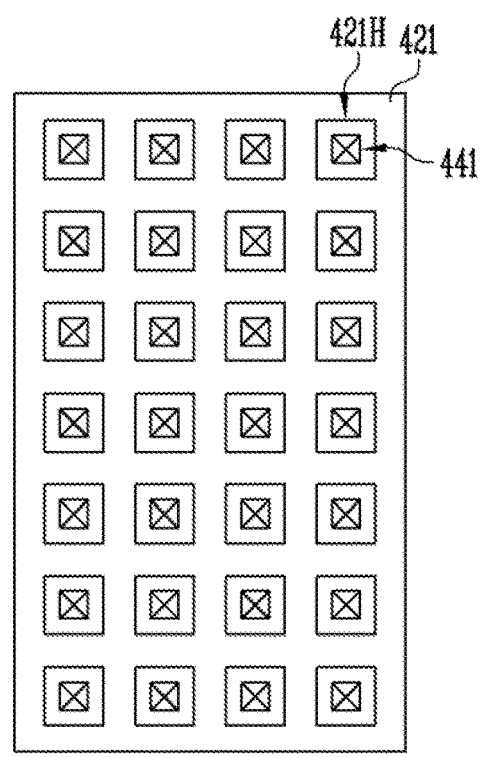
FIG. 8 is a diagram describing a capacitor of a semiconductor device according to a fourth exemplary embodiment of the present invention.

FIG. 8 is a diagram describing a capacitor of a semiconductor device according to a fourth exemplary embodiment of the present invention. For convenience of description, the same configurations, which are already described in the first and second exemplary embodiments, are not illustrated in FIG. 8. Thus, only shapes of a first electrode and second electrodes are illustrated in FIG. 8.

Referring to FIG. 8, a first electrode 421 may have a net-shaped cross-section including openings 421H, and second electrodes 441 may be disposed inside the openings 421H, respectively.

A lower surface of the second electrode 441 is positioned higher than a lower surface of the first electrode 421 likewise to the aforementioned exemplary embodiments. Accordingly, in the fourth exemplary embodiment of the present invention, the first electrode 421 and the second electrodes 441 may be spaced with a decreased distance, thereby improving efficiency of the capacitor.

The capacitor of the semiconductor device according to the fourth exemplary embodiment of the present invention may be fabricated by applying the fabricating method of the capacitor according to the aforementioned first exemplary embodiment, so that a detailed description of the fabricating method will be omitted.

Figure 9:
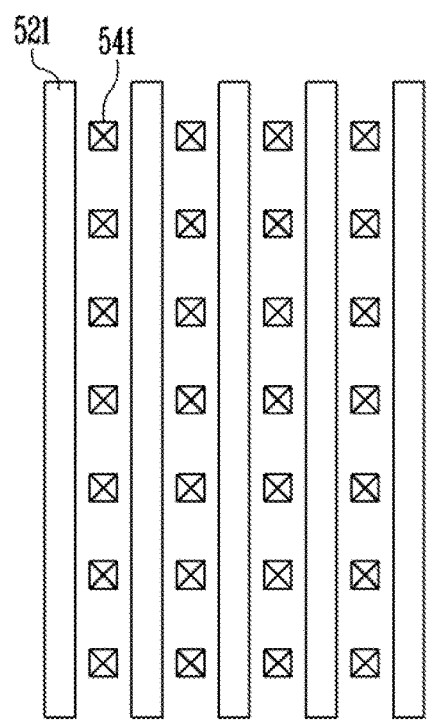
FIG. 9 is a diagram describing a capacitor of a semiconductor device according to a fifth exemplary embodiment of the present invention.

FIG. 9 is a diagram describing a capacitor of a semiconductor device according to a fifth exemplary embodiment of the present invention. For convenience of description, the same configurations, which are already described in the first and second exemplary embodiments, are not illustrated in FIG. 9. Thus, only shapes of first electrodes and second electrodes are illustrated in FIG. 9.

Referring to FIG. 9, first electrodes 521 may be formed in a shape of lines which are parallel to each other, and second electrodes 541 may be arranged in a pillar shape in a row at each region between the first electrodes 521. Otherwise, the second electrodes 541 may be formed in a shape of lines, which are parallel to each other, and the first electrodes 521 may be arranged in a pillar shape in a row at each region between the second electrodes 541.

Lower surfaces of the second electrodes 541 are positioned higher than lower surfaces of the second electrodes 521 likewise to the aforementioned exemplary embodiments. Accordingly, in the fifth exemplary embodiment of the present invention, the first electrodes 521 and the second electrodes 541 may be spaced with a decreased distance, thereby improving efficiency of the capacitor.

The capacitor of the semiconductor device according to the fifth exemplary embodiment of the present invention may be fabricated by applying the fabricating method of the capacitor according to the aforementioned first exemplary embodiment, so that a detailed description of the fabricating method will be omitted.

Figure 10:
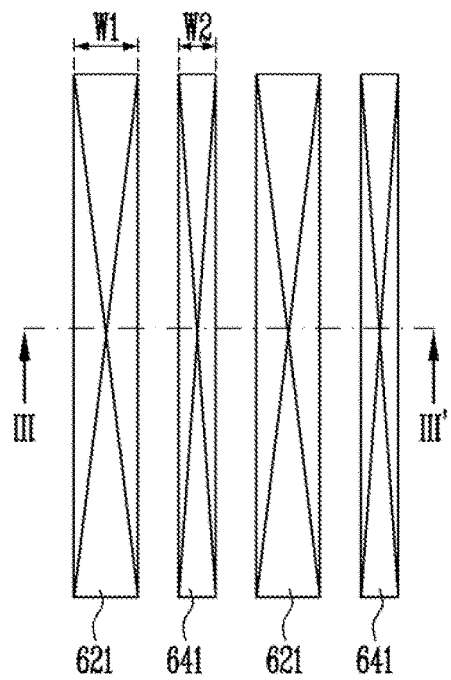
FIGS. 10 to 11 are diagrams describing a capacitor of a semiconductor device according to a sixth exemplary embodiment of the present invention.

FIG. 10 is a diagram describing a capacitor of a semiconductor device according to a sixth exemplary embodiment of the present invention. For convenience of description, the same configurations, which are already described in the first and second exemplary embodiments, are not illustrated in FIG. 10. Thus, only shapes of first electrodes and second electrodes are illustrated in FIG. 10.

First electrodes 621 and second electrodes 641 are alternately disposed, and may be formed in a shape of lines or pillars which are parallel to each other. Here, a width W1 of each of the first electrodes 621 is formed to be larger than a width W2 of each of the second electrodes 641.

Figure 11:
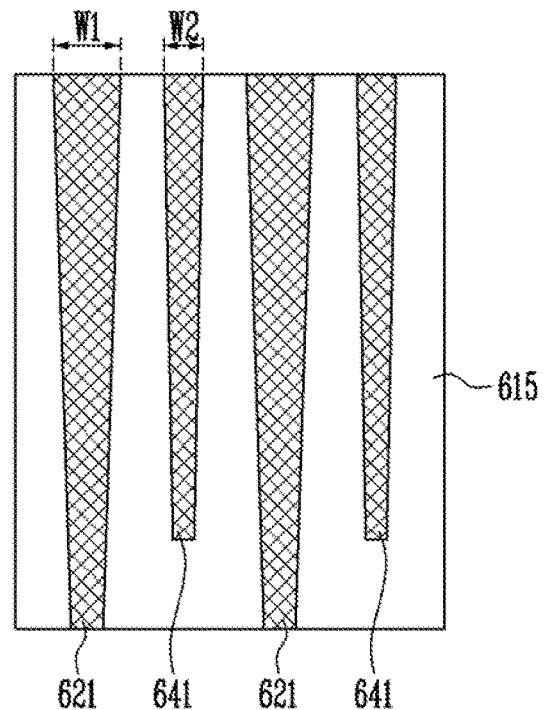

FIG. 11 is a cross-sectional view taken along the line "III-III" illustrated in FIG. 10.

Referring to FIG. 11, upper surfaces of the first electrodes 621 and the second electrodes 641 are disposed at the same levels in an insulating layer 615. Lower surfaces of the second electrodes 641 are positioned higher than lower surfaces of the second electrodes 621 likewise to the aforementioned exemplary embodiments. Accordingly, in the sixth exemplary embodiment of the present invention, the first electrodes 621 and the second electrodes 641 may be spaced with a decreased distance, thereby improving efficiency of the capacitor.

The capacitor of the semiconductor device according to the sixth exemplary embodiment of the present invention may be formed by a fabricating method described below.

First, the insulating layer 615 is formed on a substrate (not shown), and then a mask (not shown) is formed. Regions, in which the first and second electrodes 621 and 641 are to be formed, are exposed by the mask. In this case, the regions, in which the first electrodes 621 are to be formed, are exposed to be wider than the regions, in which the second electrodes 641 are to be formed by the mask.

Then, the insulating layer 615 is etched by an etching process using the mask as an etching barrier. In this case, the region exposed through a relatively larger width is etched faster. Accordingly, even though the first electrodes holes in which the first electrodes 621 are to be formed pass through a bottom surface of the insulating layer 615, the second electrode holes, in which the second electrodes 641 are to be formed, may be formed in a smaller depth than those of the first electrode holes without reaching the bottom surface of the insulating layer 615.

After forming the first and second electrode holes, the first and second electrodes 621 and 641 may be formed by filling the first and second electrode holes with a conductive layer, and removing the mask.

As described above, in the sixth exemplary embodiment of the present invention, the widths of the first electrodes 621 and the second electrodes 641 are formed to be different from each other, so that heights of the lower surfaces of the first electrodes 621 and the second electrodes 641 may be formed differently.

Figure 12:
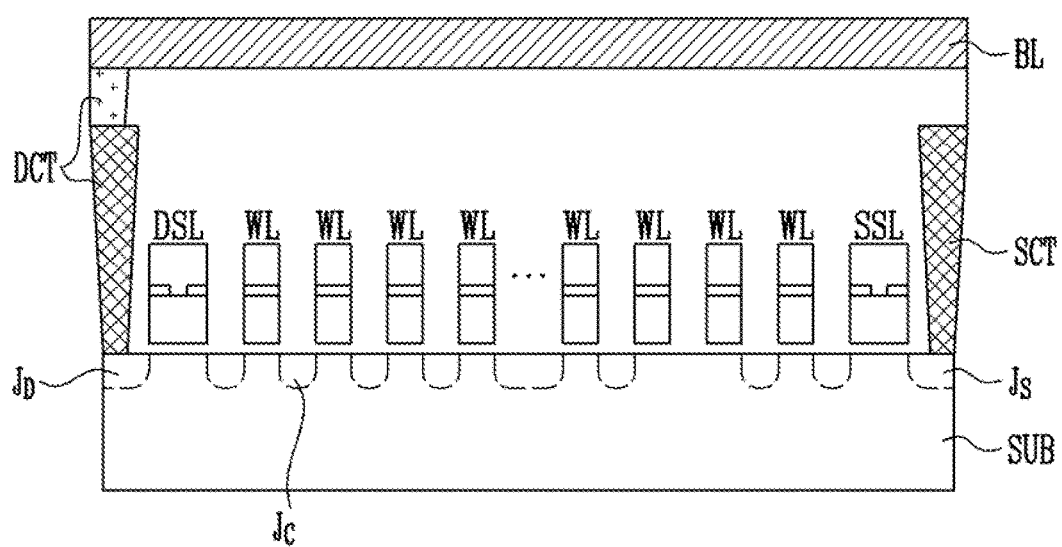
FIGS. 12 to 14 are diagrams describing a cell structure of the semiconductor devices according to the exemplary embodiments of the present invention.
Figure 13:
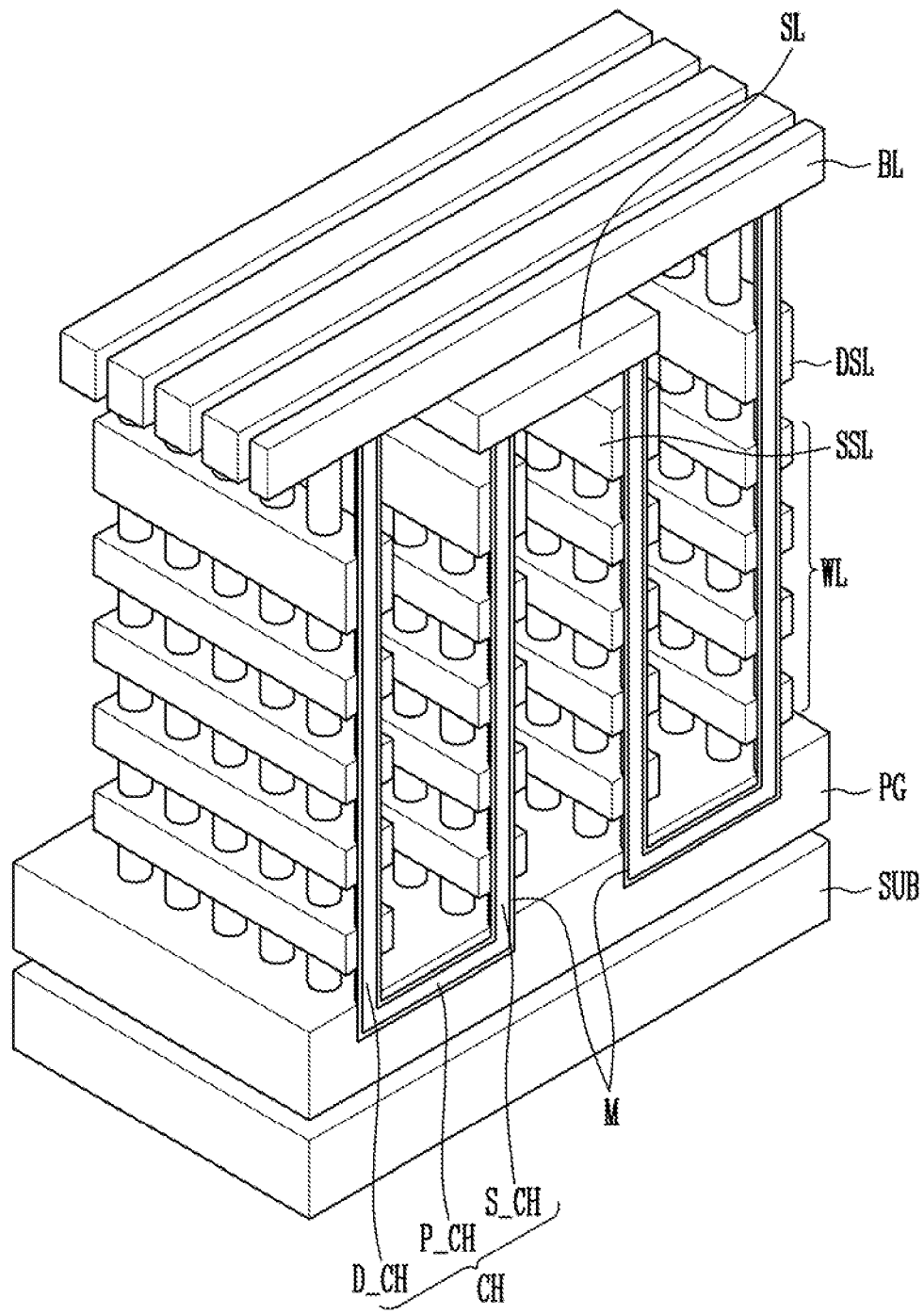
Figure 14:
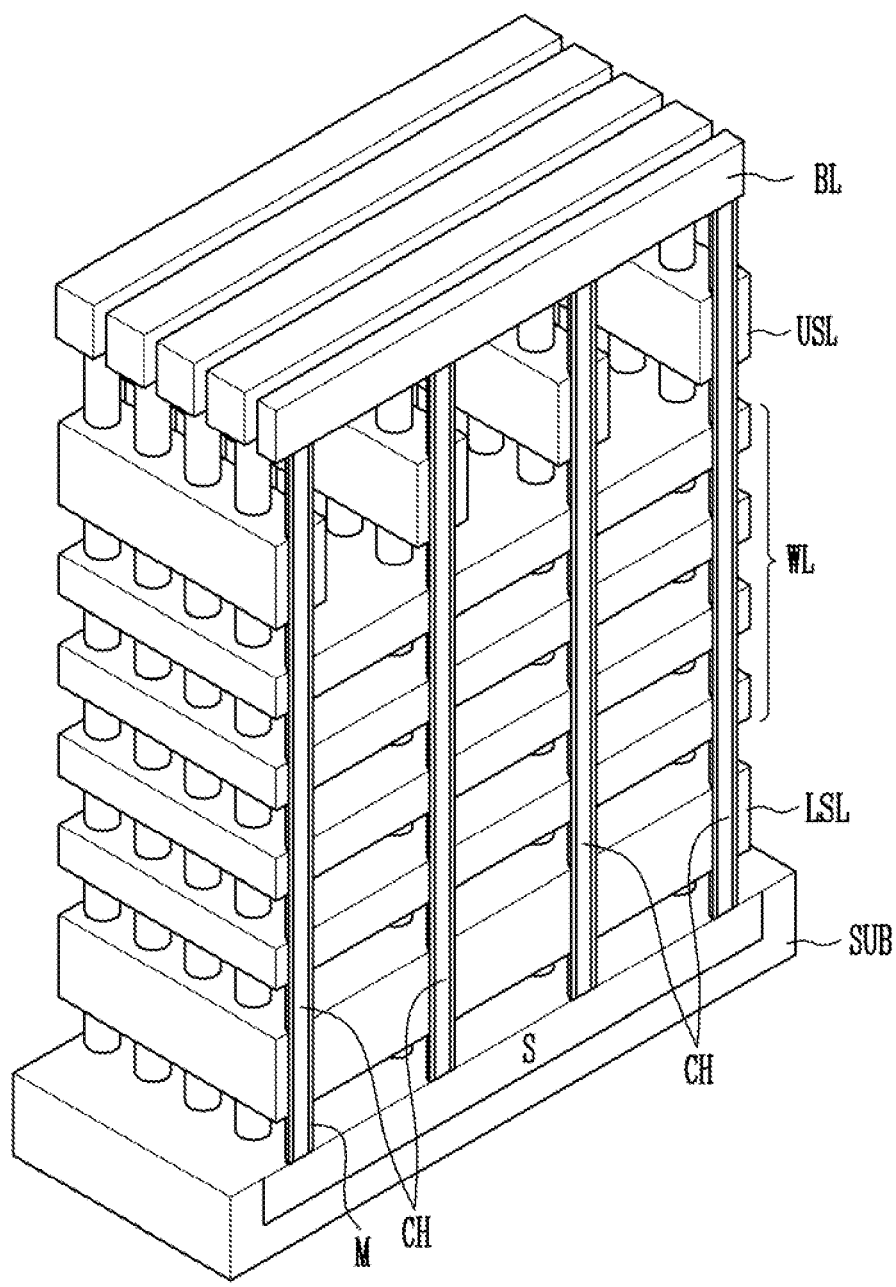

FIGS. 12 to 14 are diagrams describing a cell structure of the semiconductor devices according to the exemplary embodiments of the present invention. However, illustration of the insulating layer is omitted for convenience of description. For reference, the cell structures to be described with reference to FIGS. 12 to 14 may be fabricated by using the publicly known method, and a detailed description of a detailed fabricating method will be omitted.

FIG. 12 illustrates a cell structure including, memory cells arranged in a 2D structure on a substrate SUB.

As illustrated in FIG. 12, the cell structure includes a source selection line SSL, word lines WL, and a drain selection line DSL, which are formed on the substrate SUB in parallel. The word lines WL are disposed between the source selection line SSL and the drain selection line DSL. Each of the source selection line SSL, the word lines WL, and the drain selection line DSL may be formed in a stacked structure including a tunnel insulating layer, a data storing layer formed on the tunnel insulating layer, a dielectric layer formed on the data storing layer, and a control gate layer formed on the dielectric layer. Here, the data storing layer may be formed of a conductive layer, such as polysilicon, and the like. In this case, the data storing layer of the source selection line SSL and the drain selection line DSL may be connected to the control gate layer passing through the dielectric layer.

Further, the cell structure includes junction regions $J_S$, $J_C$, and $J_D$ formed by injecting impurities into the substrate at both sides of each of the source selection line SSL, the word lines WL, and the drain selection line DSL. The junction regions $J_S$, $J_C$, and $J_D$ are divided into the cell junction regions $J_C$ formed in the substrate at both sides of each of the word lines WL, the drain region $J_D$ formed in the substrate at one side of the drain selection line DSL, and the source region $J_S$ formed in the substrate at one side of the source selection line SSL. The source region $J_S$ is connected to a source contact line SCT, and the drain region $J_D$ is connected with a bit line BL via drain contact plugs DCT.

According to the aforementioned structure, a source selection transistor, memory cells, and a drain selection transistor, which are serially connected by the junction regions $J_S$, $J_C$, and $J_D$, form one string and are two-dimensionally arranged on the substrate SUB.

The lower wire of the capacitors of the aforementioned exemplary embodiment may be formed by using a processing of forming the source selection line SSL, the word lines WL, and the drain selection line DSL of the aforementioned cell structure. Further, the first to third contact plugs and the first and second electrodes of the capacitors of the aforementioned exemplary embodiments may be formed by using a process of forming the drain contact plugs DCT and the source contact line SCT. Further, the first to third upper wires of the capacitor of the aforementioned exemplary embodiments may be formed by using a process of forming the bit line BL.

FIG. 13 illustrates a cell structure including memory cells arranged in a 3D structure along U-shaped channel layers CH.

As illustrated in FIG. 13, a cell structure includes a pipe gate PG, word lines WL, at least one drain selection line DSL, and at least one source selection line SSL stacked on a substrate SUB.

The cell structure further includes U-shaped channel layers CH. Here, each of the channel layers CH includes a pipe channel layer P_CH formed within the pipe gate PG, and source and drain side channel layers S_CH and D_CH connected with the pipe channel layer P_CH.

Here, source side channel layers S_CH pass through word lines WL and a source selection line SSL, and drain side channel layers D_CH pass through the word lines WL and a drain selection line DSL. Further, the source side channel layers S_CH are connected with a source line SL, and the drain side channel layers D_CH are connected with bit lines BL.

Further, the semiconductor device includes thin films M interposed between the channel layers CH and the word lines WL. The thin film M may include at least one of a blocking insulating layer, a data storing layer, and a tunnel insulating layer. For example, the thin film M may include the tunnel insulating layer surrounding a side wall of each of the channel layers CH. In addition, the thin film M may further include the data storing layer surrounding the tunnel insulating layer. In addition, the thin film M may further include the blocking insulating layer surrounding the data storing layer.

According to the aforementioned structure, at least one drain selection transistor, memory cells, and at least one source selection transistor, which are serially connected, form one string and are arranged in a U-shape.

The lower wire of the capacitor of the aforementioned exemplary embodiments may be formed by using a process of forming the pipe gate PG of the aforementioned cell structure. The first electrode and the second electrode of the capacitor of the aforementioned exemplary embodiments may be formed within an insulating layer (not shown) covering the pipe gate PG, the word lines WL, at least one drain selection line DSL, and at least one source selection line SSL of the cell structure after forming the pipe gate PG, the word lines WL, at least one drain selection line DSL, and at least one source selection line SSL. In this case, depths of the first electrode and the second electrode are increased in proportion to the number of stacks of the word lines WL, so that efficiency of the capacitor may be improved.

FIG. 14 illustrates a cell structure including memory cells arranged in a 3D structure along channel layers CH having a straight shape substantially perpendicular to a surface of a substrate SUB.

As illustrated in FIG. 14, a cell structure includes at least one lower selection line LSL, word lines WL, and at least one upper selection line USL sequentially stacked on the substrate SUB. Here, the word lines WL have a plate shape, and at least one of the upper and lower selection lines USL and LSL has a line shape.

The cell structure further includes channel layers CH protruding from the substrate SUB to pass through the lower selection line LSL, the word lines WL, and the upper selection line USL. Here, upper ends of the channel layers CH are connected with bit lines LB, and lower ends of the channel layers CH are connected with a source region S.

Further, the semiconductor device includes thin films M interposed between the channel layers CH and the word lines WL. A detailed configuration of the thin film M is the same as that described with reference to FIG. 13.

According to the aforementioned structure, at least one lower selection transistor, memory cells, and at least one upper selection transistor, which are serially connected, form one string and are arranged in a row.

The lower wire of the capacitor of the aforementioned exemplary embodiments may be formed by using a process of forming the lower selection line LSL of the aforementioned cell structure. Otherwise, the lower wire of the capacitor of the aforementioned exemplary embodiments may be formed before forming the lower selection line LSL. The first electrode and the second electrode of the capacitor of the aforementioned exemplary embodiments may be formed within an insulating layer (not shown) covering the lower selection line LSL, the word lines WL, the upper selection line USL of the cell structure after forming the lower selection line LSL, the word lines WL, and the upper selection line USL. In this case, depths of the first electrode and the second electrode are increased in proportion to the number of stacks of the word lines WL, so that efficiency of the capacitor may be improved.

Figure 15:
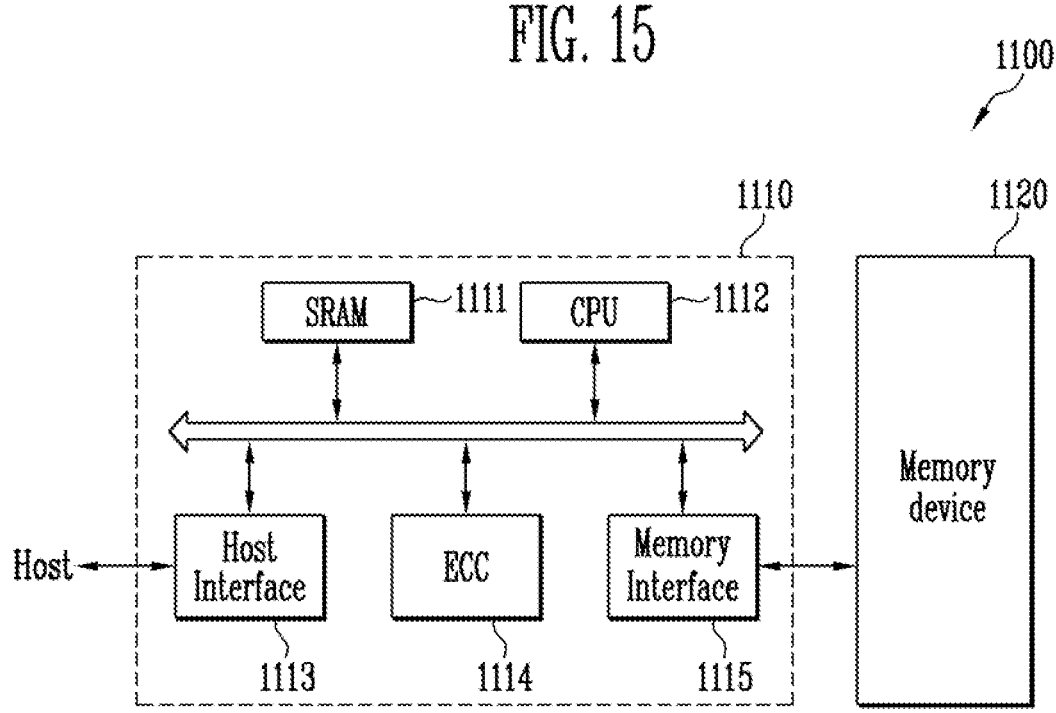
FIG. 15 is a diagram illustrating a memory system according to an exemplary embodiment of the present invention.

FIG. 15 is a configuration diagram illustrating a memory system according to an exemplary embodiment of the present invention.

Referring to FIG. 15, a memory system 1100 according to the embodiment of the present invention includes a memory device 1120 and a memory controller 1110.

The memory device 1120 has the structures of the exemplary embodiments described with reference to FIGS. 1 to 14. Further, the memory device 1120 may be a multi-chip package formed of a plurality of flash memory chips.

The memory controller 1110 may be configured to control the memory device 1120, and may include an SRAM 1111, a CPU 1112, a host interface 1113, an ECC 1114, and a memory interface 1115. The SRAM 1111 is used as a working memory of the CPU 1112, the CPU 1112 performs a general control operation for a data exchange of the memory controller 1110, and the host interface 1113 includes a data exchange protocol of a host interfacing with the memory system 1100. Further, the ECC 1114 detects and corrects an error included in data read from the memory device 1120, and the memory interface 1115 performs interfacing with the memory device 1120. In addition, the memory controller 1110 may further include an ROM for storing code data for interfacing with the host.

As described above, the memory system 1100 including the aforementioned structure may be a memory card or a Solid State Drive (SSD) in which the memory device 1120 is combined with the memory controller 1110. For example, when the memory system 1100 is the SSD, the memory controller 1110 may communicate with an external device (for example, a host) through one of various interface protocols, such as universal serial bus (USB), multimedia card (MMC), peripheral component interconnection express (PCI-E) serial advanced technology attachment (SATA), parallel advanced technology attachment (DATA), small computer system interface (SCSI), enhanced small disk interface (ESDI), and integrated drive electronics (IDE).

Figure 16:
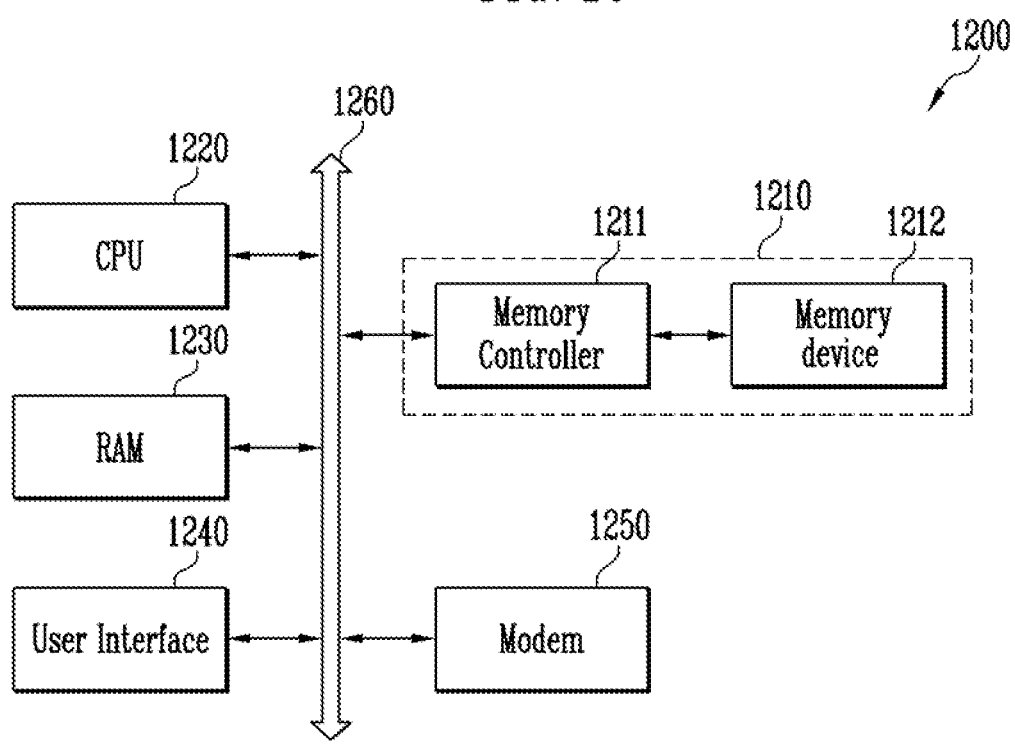
FIG. 16 is a diagram illustrating a computing system according to an exemplary embodiment of the present invention.

FIG. 16 is a configuration diagram illustrating a computing system according to an exemplary embodiment of the present invention.

Referring to FIG. 16, a computing system 1200 according to the embodiment of the present invention may include a CPU 1220, a RAM 1230, a user interface 1240, a modem 1250, and a memory system 1210, which are electrically connected to a system bus 1260. Further, if the computing system 1200 is a mobile device, the computing system 1200 may further include a battery for supplying an operating voltage to the computing system 1200, and it may further include an application chip-set, a CMOS image sensor CIS, a mobile DRAM and the like.

The memory system 1210 may be formed of a memory device 1212 and a memory controller 1211 as previously described with reference to FIG. 15.

As described above, the embodiment has been disclosed in the drawings and the specification. The specific terms used herein are for purposes of illustration, and do not limit the scope of the present invention defined in the claims. Accordingly, those skilled in the art will appreciate that various modifications and other equivalent examples may be made without departing from the scope and spirit of the present disclosure. Therefore, the sole technical protection scope of the present invention will be defined by the technical spirit of the accompanying claims.

What is claimed is:

1. A semiconductor device, comprising:
a lower wire formed on a substrate in a first direction;
impurity injection regions formed inside the substrate adjacent to edges of the lower wire;
a first insulating layer formed on the substrate to cover the lower wire;
first electrodes passing through the first insulating layer to be connected to the lower wire, wherein each of the first electrodes consists of one segment;
a second insulating layer formed on the first insulating layer to cover the first electrodes;
second electrodes passing through the second insulating layer and a part of the first insulating layer to have lower surfaces positioned higher than lower surfaces of the first electrodes, wherein each of the second electrodes consists of one segment;
first contact plugs passing through the first insulating layer to be connected to the impurity injection regions, and arranged in the first direction;
second contact plugs passing through the second insulating layer to be connected to the first contact plugs;
third contact plugs passing through the second insulating layer to be connected to the first electrodes;
first signal wires extended in a second direction to be connected onto the third contact plugs; and
second signal wires extended in the first direction to be connected to the second contact plugs, or extended in the second direction to be connected to the second electrodes,
wherein the first and second electrodes form capacitors.

2. The semiconductor device of claim 1, wherein the first and second electrodes include a plurality of pillars spaced and arranged in both the first direction and the second direction, wherein the second direction crosses the first direction.

3. The semiconductor device of claim 2, wherein the first electrodes and the second electrodes are alternately arranged in zigzag type along the first direction.

4. A semiconductor device, comprising:
a lower wire formed on a substrate in a first direction;
impurity injection regions formed inside the substrate adjacent to edges of the lower wire;
a first insulating layer formed on the substrate to cover the lower wire;
first electrodes passing through the first insulating layer to be connected to the lower wire, wherein each of the first electrodes consists of one segment;
a second insulating layer formed on the first insulating layer to cover the first electrodes;
second electrodes passing through the second insulating layer and a part of the first insulating layer to have lower surfaces positioned higher than lower surfaces of the first electrodes, wherein each of the second electrodes consists of one segment;
first contact plugs passing through the first insulating layer to be connected to the impurity injection regions, and arranged in the first direction;
second contact plugs passing through the second insulating layer to be connected to the first contact plugs;
third contact plugs passing through the second insulating layer to be connected to outermost electrodes among the first electrodes;
first signal wires extended in the first direction to be connected onto the third contact plugs; and
second signal wires extended in the first direction to be commonly connected to the second electrodes, or connected to the second contact plugs,
wherein the first electrodes are extended in the first direction and arranged in a second direction crossing the first direction, and the second electrodes are extended in the first direction and disposed between the first electrodes.

* * * * *